United States Patent
Hao et al.

(10) Patent No.: US 8,933,510 B2
(45) Date of Patent: Jan. 13, 2015

(54) DEMOS FORMED WITH A THROUGH GATE IMPLANT

(71) Applicant: Texas Instruments Incorporated, Dallas, TX (US)

(72) Inventors: Pinghai Hao, Plano, TX (US); Amitava Chatterjee, Plano, TX (US); Imran Khan, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/142,006

(22) Filed: Dec. 27, 2013

(65) Prior Publication Data

US 2014/0183630 A1    Jul. 3, 2014

Related U.S. Application Data

(60) Provisional application No. 61/747,656, filed on Dec. 31, 2012.

(51) Int. Cl.
  *H01L 29/78*  (2006.01)
  *H01L 29/66*  (2006.01)
  *H01L 21/8234*  (2006.01)

(52) U.S. Cl.
  CPC ...... *H01L 29/7816* (2013.01); *H01L 29/66681* (2013.01); *H01L 21/823412* (2013.01); *H01L 21/823418* (2013.10); *H01L 21/823456* (2013.01)
  USPC .......................................... 257/337; 438/286

(58) Field of Classification Search
  CPC .......................... H01L 29/816; H01L 29/66681
  USPC .......................................................... 257/337
  See application file for complete search history.

(56) References Cited

U.S. PATENT DOCUMENTS 7,851,314 B2 * 12/2010 Mallikarjunaswamy et al. ............................ 438/286

* cited by examiner

*Primary Examiner* — Zandra Smith
*Assistant Examiner* — Paul Patton
(74) *Attorney, Agent, or Firm* — Jacqueline J. Garner; Frederick J. Telecky, Jr.

(57) ABSTRACT

An integrated circuit containing a MOS transistor and a DEMOS transistor of a same polarity may be formed by implanting dopants of a same conductivity type as source/drain regions of the MOS transistor and the DEMOS transistor through a gate of the MOS transistor and through a gate of the DEMOS transistor. The implanted dopants are blocked from a drain-side edge of the DEMOS transistor gate. The implanted dopants form a drain enhancement region under the DEMOS transistor gate in a drift region of an extended drain of the DEMOS transistor.

20 Claims, 13 Drawing Sheets

… (1)

DEMOS FORMED WITH A THROUGH GATE IMPLANT

CROSS-REFERENCE TO RELATED APPLICATIONS

This application claims the benefit of priority under U.S.C. §119(e) of U.S. Provisional Application 61/747,656 filed Dec. 31, 2012, which is hereby incorporated by reference in its entirety.

FIELD OF THE INVENTION

This invention relates to the field of integrated circuits. More particularly, this invention relates to metal oxide semiconductor transistors in integrated circuits.

BACKGROUND OF THE INVENTION

An integrated circuit may include a low-voltage metal oxide semiconductor (MOS) transistor and a drain extended metal oxide semiconductor (DEMOS) transistor of the same polarity. Body wells and source/drain regions may be formed to provide desired performance in the low-voltage MOS transistor, such that performance of the DEMOS transistor is less than desired. Adding implants to the fabrication process to improve the DEMOS transistor may undesirably increase the fabrication cost of the integrated circuit.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit containing a MOS transistor and a DEMOS transistor of a same polarity may be formed by implanting dopants of a same conductivity type as source/drain regions of the MOS transistor and the DEMOS transistor through a gate of the MOS transistor and through a gate of the DEMOS transistor. The implanted dopants are blocked from a drain-side edge of the DEMOS transistor gate. The implanted dopants form a drain enhancement region under the DEMOS transistor gate in a drift region of an extended drain of the DEMOS transistor.

DETAILED DESCRIPTION OF EXAMPLE EMBODIMENTS

Figure 1:
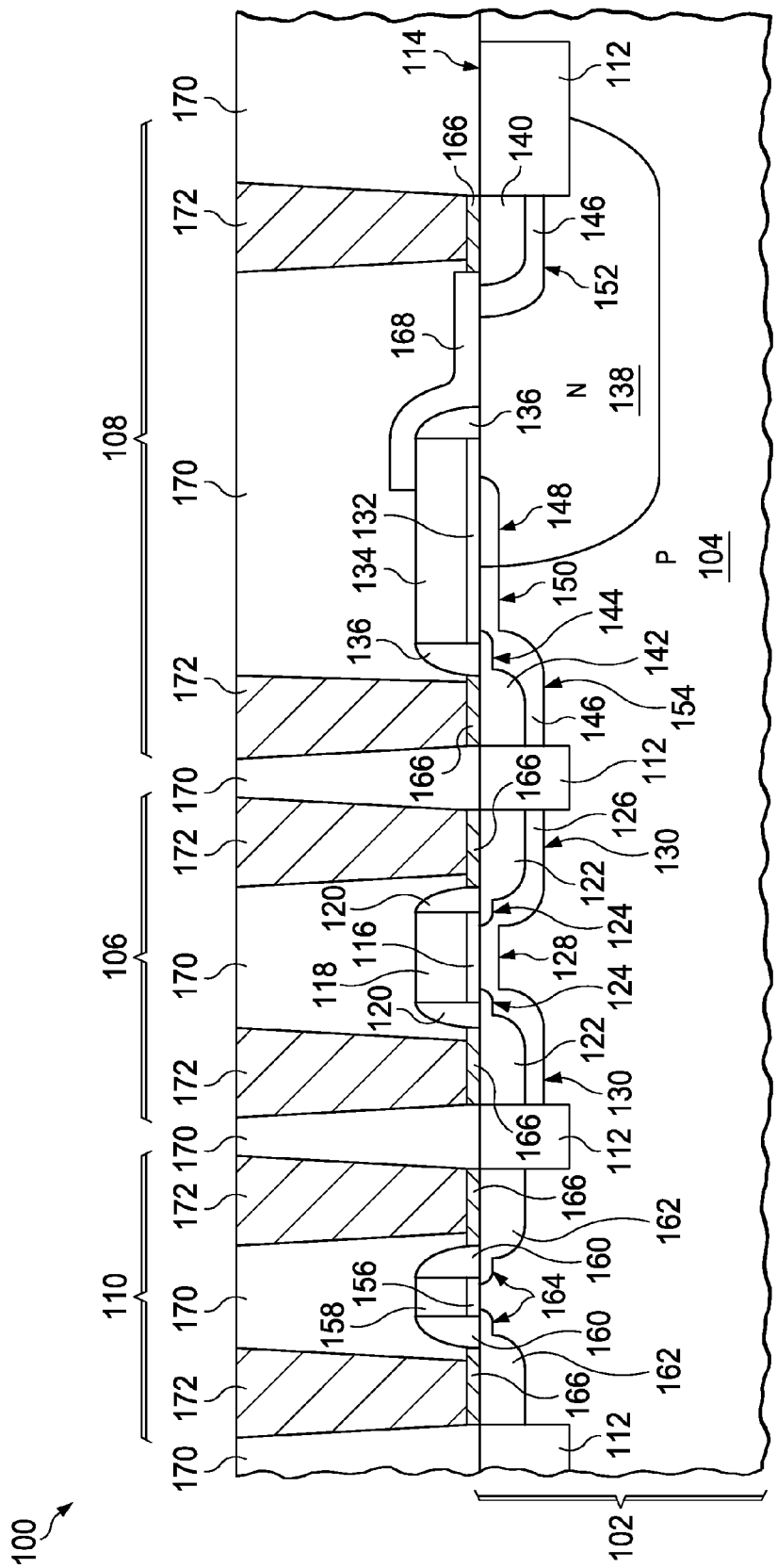
FIG. 1 is a cross section of an example integrated circuit.

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

An integrated circuit containing an n-channel metal oxide semiconductor (NMOS) transistor and a drain extended n-channel metal oxide semiconductor (DENMOS) transistor may be formed by implanting n-type dopants through a gate of the NMOS transistor and through a gate of the DENMOS transistor. The implanted n-type dopants are blocked from an edge of the DENMOS transistor gate over a drift region of an extended drain of the DENMOS transistor. The implanted n-type dopants form an n-type-dopant-implanted drift region which includes a drift enhancement layer under the DENMOS transistor gate in the drift region. The implanted n-type dopants form a threshold adjustment layer under the NMOS transistor gate and source/drain graded regions under n-type source/drain regions. A drain area of the DENMOS transistor may optionally be implanted with the n-type dopants to provide a graded doping profile to the drift region. A source area of the DENMOS transistor may optionally be implanted with the n-type dopants to provide a graded junction with a body region of the DENMOS transistor.

Analogously, an integrated circuit containing a p-channel metal oxide semiconductor (PMOS) transistor and a drain extended p-channel metal oxide semiconductor (DEPMOS) transistor may be formed by implanting p-type dopants through a gate of the PMOS transistor and through a gate of the DEPMOS transistor. The implanted p-type dopants are blocked from an edge of the DEPMOS transistor gate over a drift region of an extended drain. The implanted p-type dopants form a p-type-dopant-implanted region which includes a drift enhancement layer under the DENMOS transistor gate in a drift region of an extended drain of the DENMOS transistor, and form a threshold adjustment layer under the PMOS transistor gate and source/drain graded regions under p-type source/drain regions. A drain area and/or a source area of the DENMOS transistor may optionally be implanted with the p-type dopants to provide a graded doping profile to the drift region and/or a graded junction with a body region, respectively.

Each example disclosed herein will describe either an integrated circuit containing an NMOS transistor and a DENMOS transistor, or an integrated circuit containing a PMOS transistor and a DEPMOS transistor. For each example, an integrated circuit containing a MOS transistor and a DEMOS transistor of the opposite polarity may be formed by appropriate changes of conductivity types and dopant types.

FIG. 1 is a cross section of an example integrated circuit. The integrated circuit 100 is formed on a substrate 102 which includes p-type semiconductor material 104. The integrated circuit 100 includes an NMOS transistor 106, a DENMOS transistor 108 and possibly a low-voltage NMOS transistor 110. Field oxide 112 is disposed at a top surface 114 of the substrate 102 so as to laterally isolate the NMOS transistor 106, the DENMOS transistor 108 and the low-voltage NMOS transistor 110.

The NMOS transistor 106 includes a gate dielectric layer 116 on the substrate 102, a gate 118 on the gate dielectric layer 116, and sidewall spacers 120 laterally adjacent to the gate 118. The NMOS transistor 106 also includes n-type source/drain regions 122 in the substrate 102 adjacent to the gate 118 with drain extensions 124 extending partway under the gate 118. The NMOS transistor 106 further includes a through-gate-implanted region 126 in the substrate 102 under the gate dielectric layer 116 and the source/drain regions 122. A net doping in the through-gate-implanted region 126 is p-type, as a dose of n-type dopants used to form the through-gate-implanted region 126 is low enough so as not to counterdope the p-type semiconductor material 104 to n-type. The through-gate-implanted region 126 includes a threshold adjustment layer 128 under the gate dielectric layer 116 and source/drain graded regions 130 under the source/drain regions 122.

The DENMOS transistor 108 includes a gate dielectric layer 132 on the substrate 102, a gate 134 on the gate dielectric layer 132, and sidewall spacers 136 laterally adjacent to the gate 134. A thickness of the gate dielectric layer 132 of the DENMOS transistor 108 may be substantially equal to a thickness of the gate dielectric layer 116 of the NMOS transistor 106. The DENMOS transistor 108 also includes an n-type drift region 138 in the substrate 102 extending partway under the gate 134. The DENMOS transistor 108 also includes an n-type drain region 140 in the substrate 102 abutting the drift region 138. In the instant example, the drain region 140 is laterally separated from the gate 134. The DENMOS transistor 108 also includes an n-type source region 142 in the substrate 102 adjacent to the gate 134 with a source extension 144 extending partway under the gate 134. The DENMOS transistor 108 further includes a through-gate-implanted region 146 in the substrate 102 under the gate 134, under the drain region 140 and under the source region 142. The through-gate-implanted region 146 includes a drift enhancement layer 148 in the drift region 138 under the gate dielectric layer 132. The drift enhancement layer 148 does not extend to an end of the gate 134 closest to the drain region 140. In the instant example, the through-gate-implanted region 146 also includes a threshold adjustment layer 150 in the p-type semiconductor material 104 under the gate 134, a drain graded region 152 under the drain region 140 and a source graded region 154 under the source region 142.

The optional low-voltage NMOS transistor 110, if present, includes a gate dielectric layer 156 on the substrate 102, a gate 158 on the gate dielectric layer 156, and sidewall spacers 160 laterally adjacent to the gate 158. The gate dielectric layer 156 of the low-voltage NMOS transistor 110 is thinner than the gate dielectric layer 116 of the NMOS transistor 106. For example, the gate dielectric layer 156 of the low-voltage NMOS transistor 110 one-third to two-thirds as thick as the gate dielectric layer 116 of the NMOS transistor 106. The low-voltage NMOS transistor 110 also includes n-type source/drain regions 162 in the substrate 102 adjacent to the gate 158 with drain extensions 164 extending partway under the gate 158. The low-voltage NMOS transistor 110 is free of a through-gate-implanted region similar to the through-gate-implanted regions 126 and 146 in the NMOS transistor 106 and the DENMOS transistor 108, respectively.

The low-voltage NMOS transistor 110 may be part of a core logic component of the integrated circuit 100, and the NMOS transistor 106 may be part of an input/output (I/O) circuit of the integrated circuit 100. The DENMOS transistor 108 may be part of an interface circuit which handles external signals into and/or out of the integrated circuit 100.

The integrated circuit 100 includes metal silicide 166, such as titanium silicide, cobalt silicide, or nickel silicide, on the source/drain regions 122 of the NMOS transistor 106, on the drain region 140 and the source region 142 of the DENMOS transistor 108, and on the source/drain regions 162 of the low-voltage NMOS transistor 110. In the instant example, the metal silicide 166 is blocked from the substrate 102 between the gate 134 and the drain region 140 of the DENMOS transistor 108 by a silicide block 168 which advantageously provides a full depth of the drift region 138 between the gate 134 and the drain region 140.

The integrated circuit 100 includes a pre-metal dielectric (PMD) layer 170 over the substrate 102, the NMOS transistor 106, the DENMOS transistor 108, the low-voltage NMOS transistor 110, and the metal silicide 166. The PMD layer 170 may possibly include a contact etch stop layer (CESL) of silicon nitride as a bottom sublayer of the PMD layer 170, and possibly a cap layer of silicon nitride or silicon oxnitride as a top sublayer of the PMD layer 170. Contacts 172 are formed through the PMD layer 170 to make electrical connections through the metal silicide 166 to the source/drain regions 122 of the NMOS transistor 106, the drain region 140 and the source region 142 of the DENMOS transistor 108, and the source/drain regions 162 of the low-voltage NMOS transistor 110.

During operation of the integrated circuit 100, the threshold adjustment layer 128 under the gate dielectric layer 116 of the NMOS transistor 106 advantageously provides a desired threshold voltage. The source/drain graded regions 130 under the source/drain regions 122 of the NMOS transistor 106 advantageously provide a higher drain-source breakdown voltage. The drift enhancement layer 148 in the drift region 138 under the gate 134 of the DENMOS transistor 108 advantageously enables a higher operating voltage at the drain region 140 by reducing an electric field under the gate 134 in the drift region 138. The threshold adjustment layer 150 in the p-type semiconductor material 104 under the gate 134 of the DENMOS transistor 108 advantageously provides a desired threshold voltage. The drain graded region 152 under the drain region 140 of the DENMOS transistor 108 advantageously enables a higher current density through the drain region 140 without limiting the transit time of electrons in the drift region 138 due to the Kirk effect. The source graded region 154 under the source region 142 of the DENMOS transistor 108 advantageously reduces an ohmic resistance of the source region 142. An integrated circuit containing a PMOS transistor and a DEPMOS transistor similar to the instant example may accrue the same advantages of the instant example.

Figure 2A:
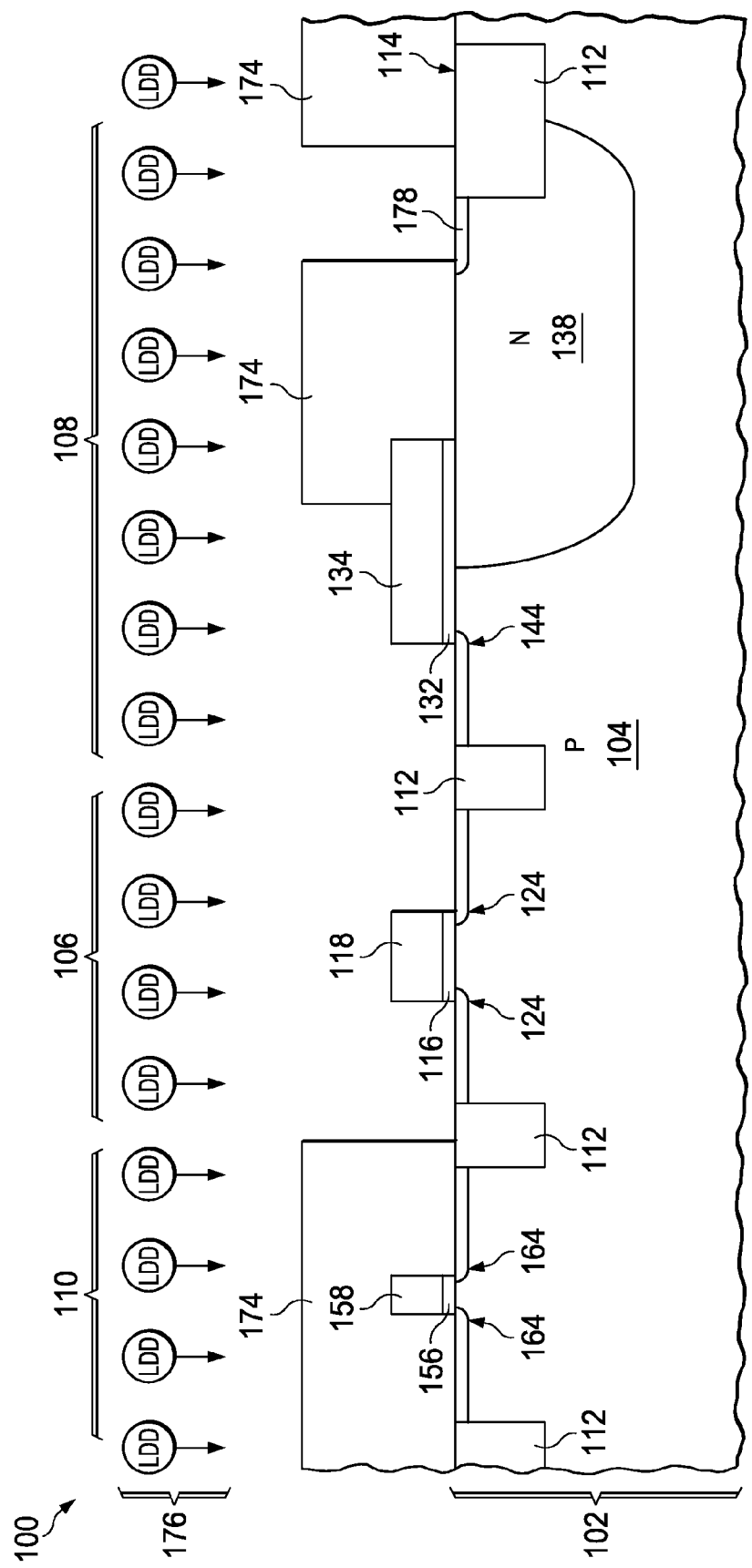
FIG. 2A through FIG. 2D are cross sections of the integrated circuit of FIG. 1, depicted at key stages of fabrication.

FIG. 2A through FIG. 2D are cross sections of the integrated circuit of FIG. 1, depicted at key stages of fabrication. Referring to FIG. 2A, the integrated circuit 100 includes the field oxide 112 laterally isolating the NMOS transistor 106, the DENMOS transistor 108 and the low-voltage NMOS transistor 110. The field oxide 112 may be formed by a shallow trench isolation (STI) process. The drift region 138 of the DENMOS transistor 108 may be formed, for example, by implanting n-type dopants such as phosphorus at a dose of $1 \times 10^{12}$ cm$^{-2}$ to $1 \times 10^{13}$ cm$^{-2}$ and subsequently performing a thermal drive process to diffuse and activate the implanted n-type dopants.

The gate dielectric layer 116 of the NMOS transistor 106 is formed at the top surface 114 of the substrate 102, for example by thermal oxidation of silicon in the semiconductor material 104. The gate dielectric layer 116 may include nitrogen and/or metals such as hafnium, tantalum and/or zirconium to improve performance of the NMOS transistor 106. The gate dielectric layer 132 of the DENMOS transistor 108 is formed at the top surface 114 of the substrate 102, possibly concurrently with the gate dielectric layer 116 of the NMOS transistor 106. The gate dielectric layer 156 of the low-voltage NMOS transistor 110 is formed at the top surface 114 of the substrate 102, possibly concurrently with a portion, but not all, of the gate dielectric layer 116 of the NMOS transistor 106. The gate 118 of the NMOS transistor 106, the gate 134 of the DENMOS transistor 108, and the gate 158 of the low-voltage NMOS transistor 110 are formed, possibly concurrently, on the gate dielectric layer 116 of the NMOS transistor 106, the gate dielectric layer 132 of the DENMOS transistor 108 and the gate dielectric layer 156 of the low-voltage NMOS transistor 110, respectively. The gates 118, 132 and 158 may be formed by forming a layer of polycrystalline silicon, commonly referred to as polysilicon, over the gate dielectric layers 116, 132 and 156, and forming a gate etch mask over the layer of polysilicon. A gate etch process removes polysilicon exposed by the gate mask to leave the gates 118, 132 and 158.

The n-type drain extensions 164 of the low-voltage NMOS transistor 110 are formed in the substrate 102 adjacent to the gate 158 by implanting n-type dopants such as phosphorus and arsenic at a dose of $5 \times 10^{13}$ cm$^{-2}$ to $5 \times 10^{14}$ cm$^{-2}$ after the gate 158 is formed. A halo implant process may implant p-type dopants such as boron at an angle into the substrate 102 adjacent to the gate 158 to improve performance of the low-voltage NMOS transistor 110.

An implant mask 174 is formed over the integrated circuit 100 so as to expose the NMOS transistor 106, and a source area and a portion of the gate 134 of the DENMOS transistor 108. The implant mask 174 may include primarily photoresist or may include hard mask material such as silicon dioxide or silicon nitride. The implant mask 174 covers an end of the gate 134 of the DENMOS transistor 108 closest to the drain region 140 and covers the substrate 102 between the gate 134 and the drain region 140 of FIG. 1, and exposes an area for the drain region 140, as depicted in FIG. 2A. The implant mask 174 also covers the low-voltage NMOS transistor 110. N-type dopants 176 such as phosphorus and/or arsenic, labeled "LDD" in FIG. 2A for "lightly doped drain," are implanted into the substrate adjacent to the gate 118 to form the drain extensions 124 of the NMOS transistor 106 and to form the source extension 144 of the DENMOS transistor 108, and an implanted region 178 in the area for the drain region 140. An implant energy of the n-type dopants 176 is low enough so that no significant portion, that is less than 1 percent, of the n-type dopants 176 penetrates the gates 118 and 134.

Figure 2B:
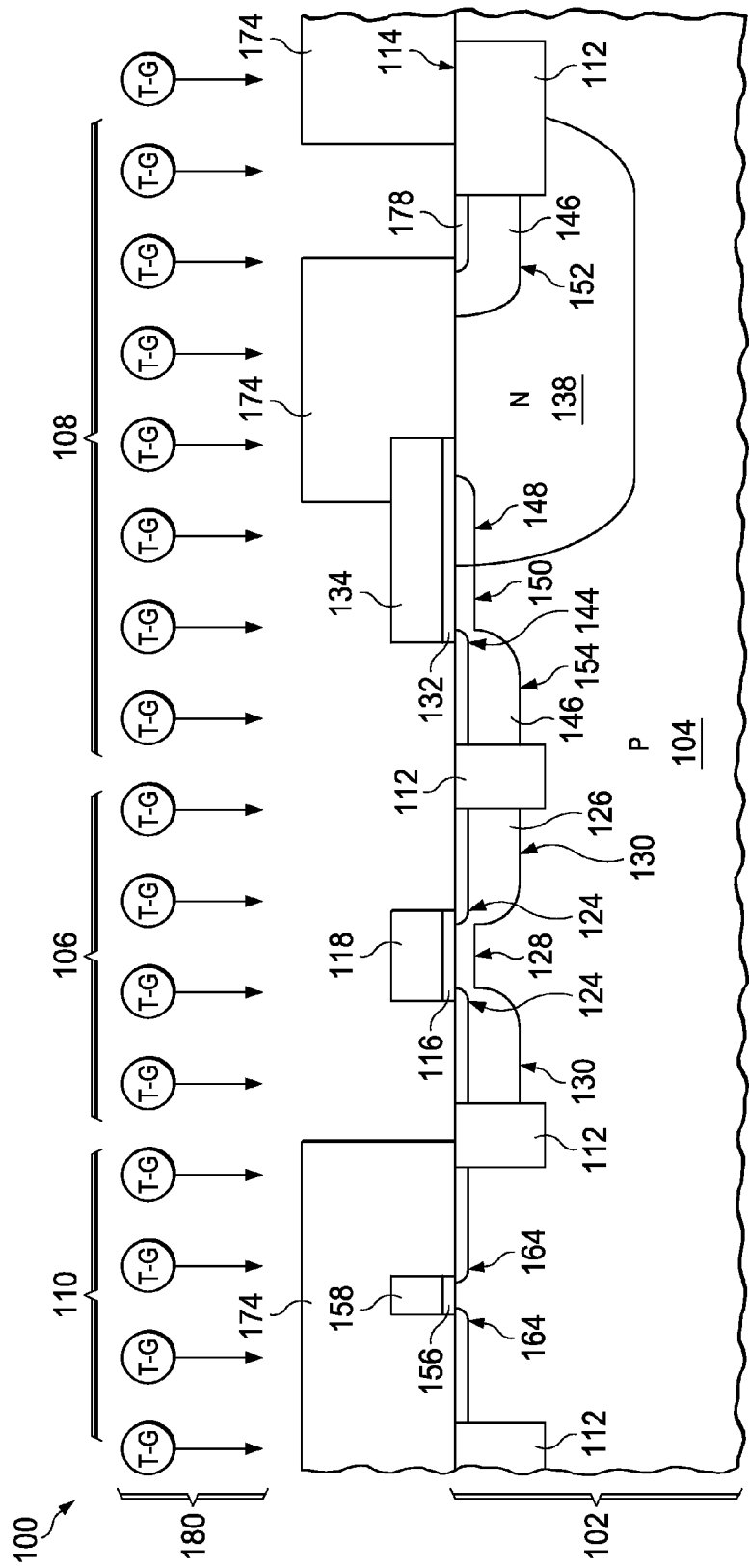

Referring to FIG. 2B, the implant mask 174 remains in place. Additional n-type dopants 180, labeled "T-G" in FIG. 2B for "through-gate," are implanted into the substrate 102 to form the through-gate-implanted region 126 of the NMOS transistor 106 and the through-gate-implanted region 146 of the DENMOS transistor 108. An implant energy of the n-type dopants 180 is high enough for the n-type dopants 180 to penetrate the gate 118 to form the threshold adjustment layer 128 under the gate dielectric layer 116 in the NMOS transistor 106 and to penetrate the gate 134 form the drift enhancement layer 148 and the threshold adjustment layer 150 under the gate dielectric layer 132 in the DENMOS transistor 108. The implant energy of the n-type dopants 180 also provides desired depths for the source/drain graded regions 130 in the NMOS transistor 106 and for the drain graded region 152 and the source graded region 154 in the DENMOS transistor 108. Forming the through-gate-implanted region 146 of the DEN-MOS transistor 108 concurrently with the through-gate-implanted region 126 of the NMOS transistor 106 may desirably reduce fabrication cost and complexity of the integrated circuit 100. The n-type dopants 176 of FIG. 2A and the additional n-type dopants 180 may optionally be implanted in a different order. The implant mask 174 is removed after the n-type dopants 176 and the additional n-type dopants 180 are implanted.

Figure 2C:
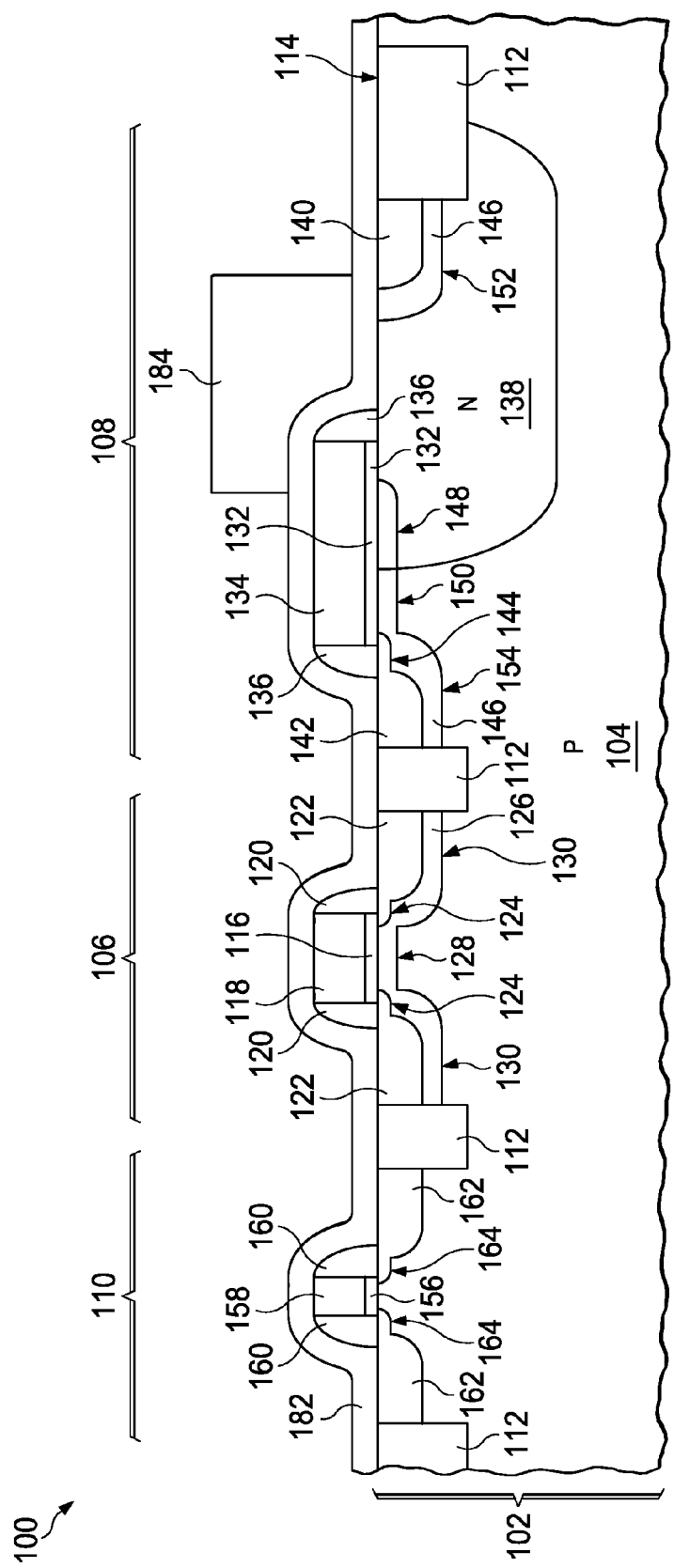

Referring to FIG. 2C, the sidewall spacers 120 laterally adjacent to the gate 118 of the NMOS transistor 106, the sidewall spacers 136 laterally adjacent to the gate 134 of the DENMOS transistor 108, and the sidewall spacers 160 laterally adjacent to the gate 158 of the low-voltage NMOS transistor 110 are formed. The sidewall spacers 120, 136 and 160 may be formed by forming a conformal layer of sidewall material such as one or more layers of silicon nitride and silicon dioxide over an existing top surface of the integrated circuit 100 and performing an anisotropic etch which removes the sidewall material from tops of, and from between, the gates 118, 134 and 158, to leave the sidewall spacers 120, 136 and 160.

The source/drain regions 122 of the NMOS transistor 106, the drain region 140 and the source region 142 of the DEN-MOS transistor 108, and the source/drain regions 162 of the low-voltage NMOS transistor 110 are subsequently formed by implanting n-type dopants such as phosphorus and arsenic into the substrate 102 at a total dose of, for example, $5 \times 10^{15}$ cm$^{-2}$ to $5 \times 10^{16}$ cm$^{-2}$, followed by an activation anneal which diffuses and activate the implanted dopants.

A layer of silicide block material 182 is formed over an existing top surface of the integrated circuit 100. The layer of silicide block material 182 may include one or more layers of silicon dioxide and/or silicon nitride, formed by plasma enhanced chemical vapor deposition (PECVD) processes using tetraethyl orthosilicate, also known as tetraethoxysilane or TEOS and/or bis (tertiary-butylamino) silane (BTBAS), respectively. An etch mask 184 is formed over the layer of silicide block material 182 so as to cover the substrate 102 between the gate 134 and the drain region 140 of the DEN-MOS transistor 108.

Figure 2D:
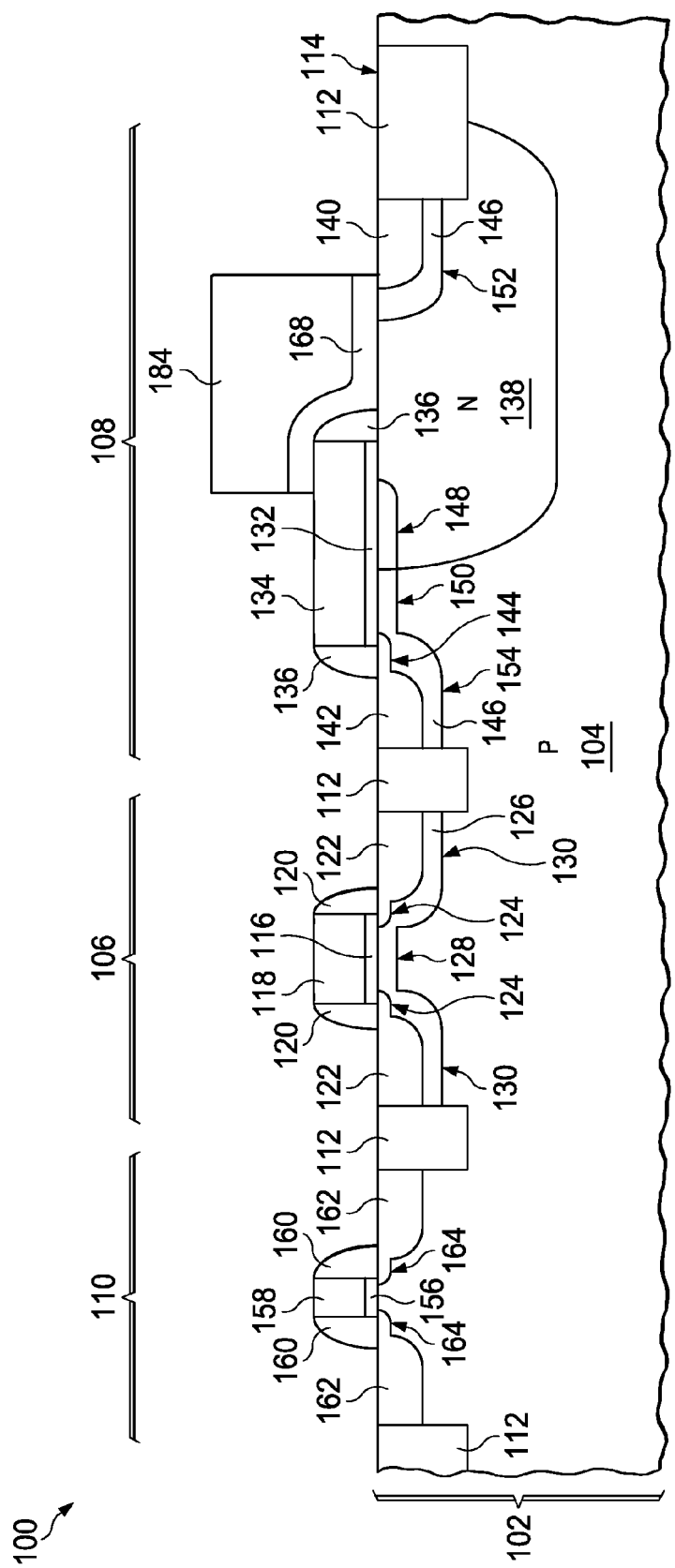

Referring to FIG. 2D, an etch process removes the layer of silicide block material 182 exposed by the etch mask 184, leaving the silicide block 168. The etch mask 184 is subsequently removed. Fabrication is continued to produce the integrated circuit 100 of FIG. 1.

Figure 3:
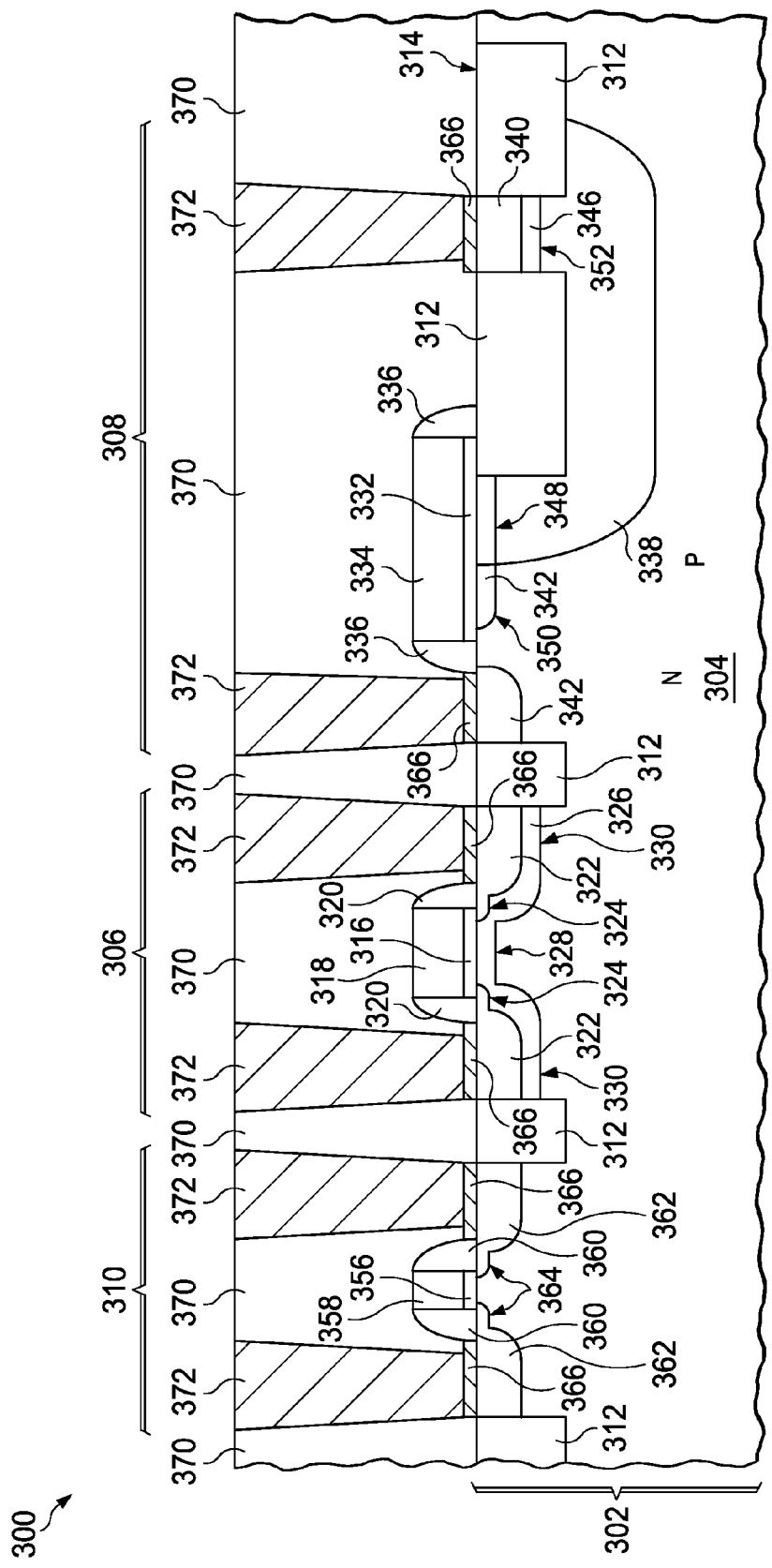
FIG. 3 is a cross section of another example integrated circuit.

FIG. 3 is a cross section of another example integrated circuit. The integrated circuit 300 is formed on a substrate 302 which includes n-type semiconductor material 304. The integrated circuit 300 includes a PMOS transistor 306, a DEP-MOS transistor 308 and possibly a low-voltage PMOS transistor 310. Field oxide 312 is disposed at a top surface 314 of the substrate 302 so as to laterally isolate the PMOS transistor 306, the DEPMOS transistor 308 and the low-voltage PMOS transistor 310.

The PMOS transistor 306 includes a gate dielectric layer 316 on the substrate 302, a gate 318 on the gate dielectric layer 316, sidewall spacers 320 laterally adjacent to the gate 318, p-type source/drain regions 322 in the substrate 302 adjacent to the gate 318 with drain extensions 324 extending partway under the gate 318. The PMOS transistor 306 further includes a through-gate-implanted region 326 in the substrate 302 under the gate dielectric layer 316 and the source/drain regions 322. A net doping in the through-gate-implanted region 326 is n-type, as a dose of p-type dopants used to form the through-gate-implanted region 326 is low enough so as not to counterdope the n-type semiconductor material 304 to p-type. The through-gate-implanted region 326 includes a threshold adjustment layer 328 under the gate dielectric layer 316 and source/drain graded regions 330 under the source/drain regions 322.

The DEPMOS transistor 308 includes a gate dielectric layer 332 on the substrate 302, a gate 334 on the gate dielectric layer 332, and sidewall spacers 336 laterally adjacent to the gate 334. A thickness of the gate dielectric layer 332 of the DEPMOS transistor 308 may be substantially equal to a thickness of the gate dielectric layer 316 of the PMOS transistor 306. The DEPMOS transistor 308 also includes a p-type drift region 338 in the substrate 302 extending partway under the gate 334. The DEPMOS transistor 308 also includes a p-type drain region 340 in the substrate 302 abutting the drift region 338. In the instant example, the drain region 340 is laterally separated from the gate 334; a portion of the field oxide 312 is disposed in the substrate 102 between the gate 334 and the drain region 340, extending partway under the gate 334. The drift region 338 extends under the field oxide 312 and abuts the gate dielectric layer 332 at one end and the drain region 340 at an opposite end. The DEPMOS transistor 308 also includes a p-type source region 342 in the substrate 302 adjacent to the gate 334 with a source extension 344 extending partway under the gate 334. The DEPMOS transistor 308 further includes a through-gate-implanted region 346 in the substrate 302 under the gate 334 and under the drain region 340. The through-gate-implanted region 346 includes a drift enhancement layer 348 in the drift region 338 under the gate dielectric layer 332; the drift enhancement layer 348 does not extend to an end of the gate 334 closest to the drain region 340. In the instant example, the through-gate-implanted region 346 also includes a threshold adjustment layer 350 in the p-type semiconductor material 304 under the gate 334 and a drain graded region 352 under the drain region 340.

The optional low-voltage PMOS transistor 310, if present, includes a gate dielectric layer 356 on the substrate 302, a gate 358 on the gate dielectric layer 356, and sidewall spacers 360 laterally adjacent to the gate 358. The gate dielectric layer 356 of the low-voltage PMOS transistor 310 is thinner than, possibly one-third to two-thirds as thick as, the gate dielectric layer 316 of the PMOS transistor 306. The low-voltage PMOS transistor 310 also includes p-type source/drain regions 362 in the substrate 302 adjacent to the gate 358 with drain extensions 364 extending partway under the gate 358. The low-voltage PMOS transistor 310 is free of a through-gate-implanted region similar to the through-gate-implanted regions 326 and 346 in the PMOS transistor 306 and the DEPMOS transistor 308, respectively.

The integrated circuit 300 includes metal silicide 366, such as titanium silicide, cobalt silicide, or nickel silicide, on the source/drain regions 322 of the PMOS transistor 306, on the drain region 340 and the source region 342 of the DEPMOS transistor 308, and on the source/drain regions 362 of the low-voltage PMOS transistor 310. In the instant example, the metal silicide 366 is blocked from the substrate 302 between the gate 334 and the drain region 340 of the DEPMOS transistor 308 by the field oxide 312, which may advantageously be used in fabrication sequences which do not include silicide block layers.

The integrated circuit 300 includes a PMD layer 370 as described in reference to FIG. 1. Contacts 372 are formed through the PMD layer 370 to make electrical connections through the metal silicide 366 to the source/drain regions 322 of the PMOS transistor 306, the drain region 340 and the source region 342 of the DEPMOS transistor 308, and the source/drain regions 362 of the low-voltage PMOS transistor 310.

The drift enhancement layer 348 in the drift region 338 under the gate 334 of the DEPMOS transistor 308, the threshold adjustment layer 350 in the n-type semiconductor material 304 under the gate 334, and the drain graded region 352 under the drain region 340 provide the advantages described in reference to FIG. 1. An integrated circuit containing an NMOS transistor and a DENMOS transistor similar to the instant example may accrue the same advantages of the instant example.

Figure 4A:
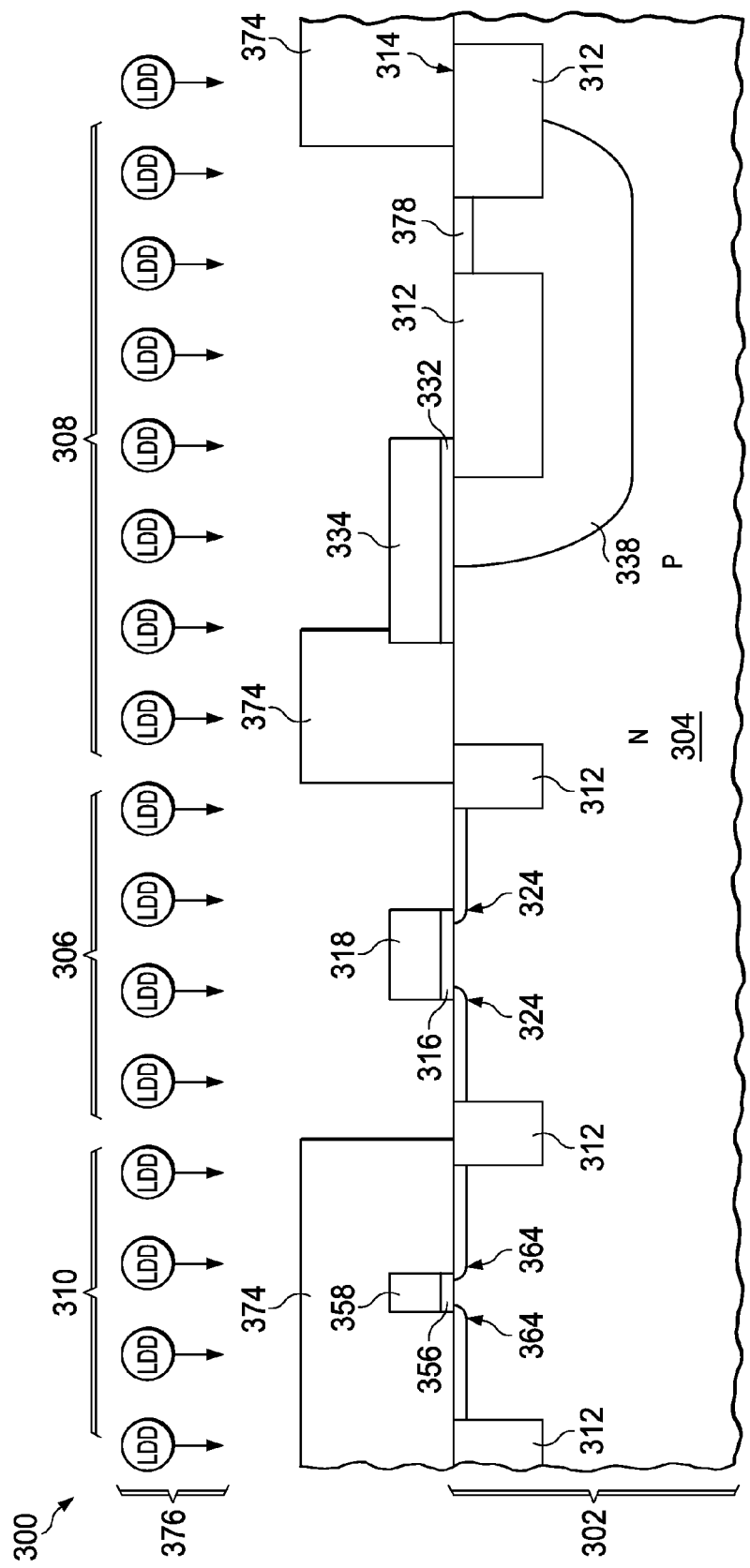
FIG. 4A through FIG. 4C are cross sections of the integrated circuit of FIG. 3, depicted at key stages of fabrication.
Figure 4B:
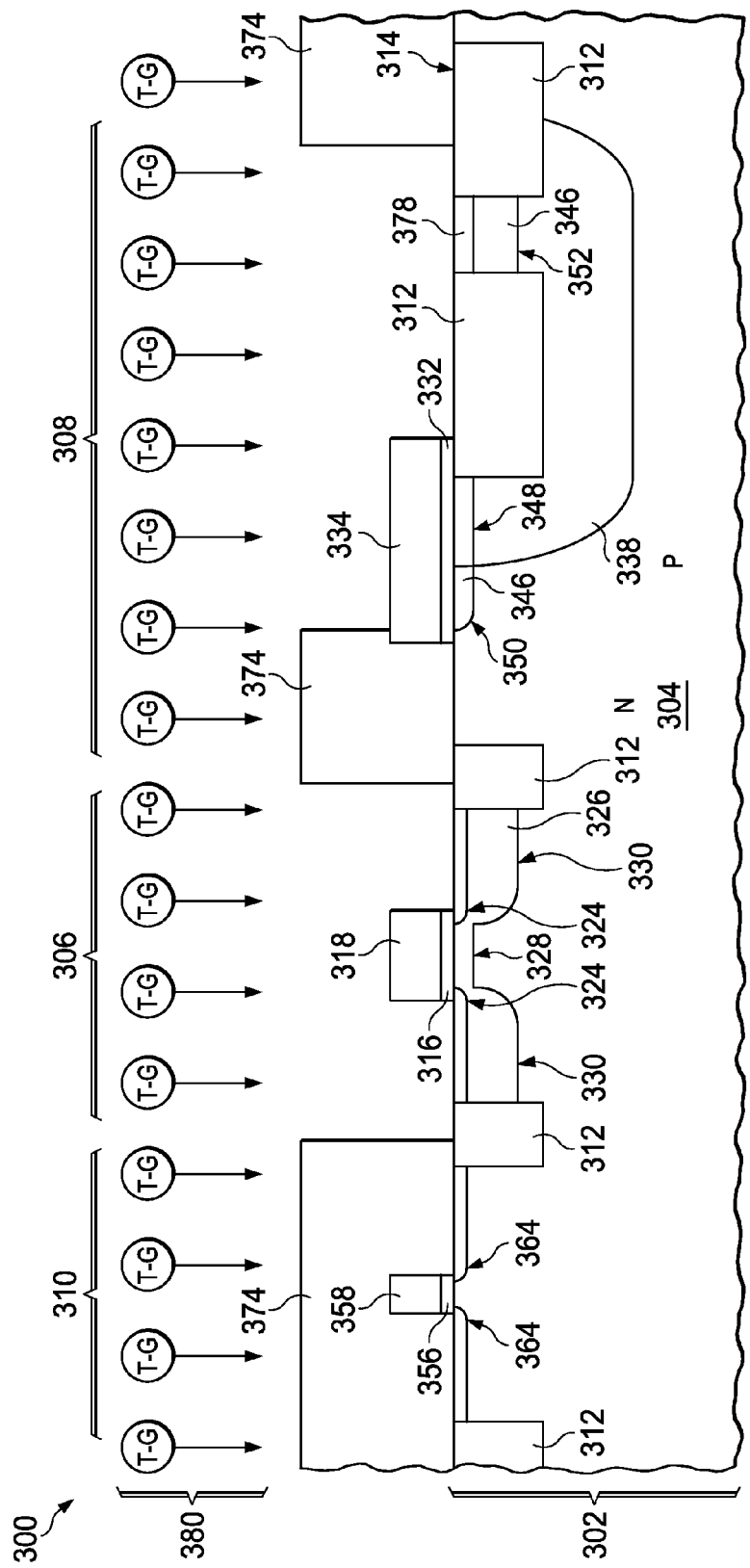
Figure 4C:
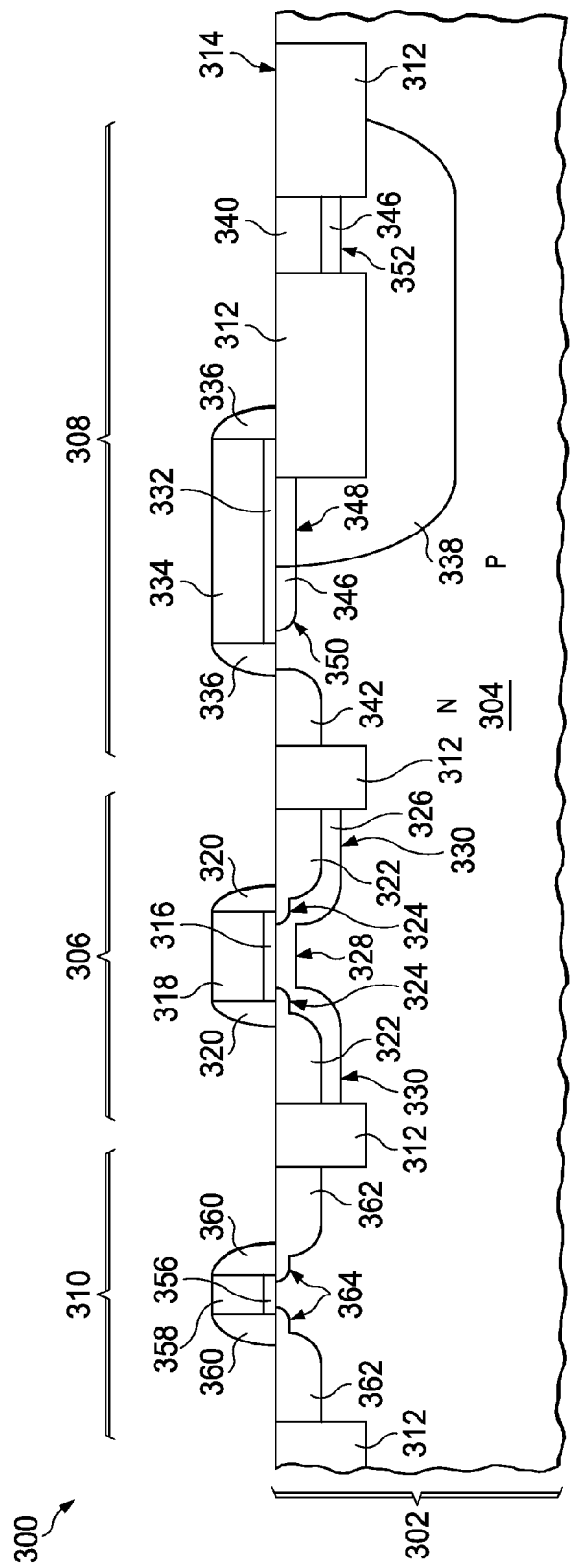

FIG. 4A through FIG. 4C are cross sections of the integrated circuit of FIG. 3, depicted at key stages of fabrication. Referring to FIG. 4A, the integrated circuit 300 includes the field oxide 312 laterally isolating the PMOS transistor 306, the DEPMOS transistor 308 and the low-voltage PMOS transistor 310, and separating the gate 334 of the DEPMOS transistor 308 from an area for the drain region 340 of FIG. 3. The drift region 338 of the DEPMOS transistor 308 may be formed, for example, by implanting p-type dopants such as boron at a dose of $1 \times 10^{12}$ cm$^{-2}$ to $1 \times 10^{13}$ cm$^{-2}$ and subsequently performing a thermal drive process to diffuse and activate the implanted p-type dopants.

The gate dielectric layer 316 of the PMOS transistor 306 and the gate dielectric layer 332 of the DEPMOS transistor 308 are formed at the top surface 314 of the substrate 302, possibly concurrently. The gate dielectric layer 356 of the low-voltage PMOS transistor 310 is formed at the top surface 314 of the substrate 302, at least a portion separately from the gate dielectric layer 316 of the PMOS transistor 306. The gate 318 of the PMOS transistor 306, the gate 334 of the DEPMOS transistor 308, and the gate 358 of the low-voltage PMOS transistor 310 are formed, possibly concurrently, on the gate dielectric layer 316 of the PMOS transistor 306, the gate dielectric layer 332 of the DEPMOS transistor 308 and the gate dielectric layer 356 of the low-voltage PMOS transistor 310, respectively.

The p-type drain extensions 364 of the low-voltage PMOS transistor 310 are formed in the substrate 302 adjacent to the gate 358 by implanting p-type dopants such as boron at a dose of $5 \times 10^{13}$ cm$^{-2}$ to $5 \times 10^{14}$ cm$^{-2}$ after the gate 358 is formed. A halo implant process may implant n-type dopants such as phosphorus and/or arsenic at an angle into the substrate 302 adjacent to the gate 358 to improve performance of the low-voltage PMOS transistor 310.

An implant mask 374 is formed over the integrated circuit 300 so as to expose the PMOS transistor 306, and the drain area and a portion of the gate 334 of the DEPMOS transistor 308. The implant mask 374 also covers the low-voltage PMOS transistor 310. P-type dopants 376 such as boron, labeled "LDD" in FIG. 4A, are implanted into the substrate adjacent to the gate 318 to form the drain extensions 324 of the PMOS transistor 306 and to form an implanted region 378 in the area for the drain region 340. An implant energy of the p-type dopants 376 is low enough so that no significant portion, that is less than 1 percent, of the p-type dopants 376 penetrates the gates 318 and 334.

Referring to FIG. 4B, the implant mask 374 remains in place. Additional p-type dopants 380 such as boron, labeled "T-G" in FIG. 4B, are implanted into the substrate 302 to form the through-gate-implanted region 326 of the PMOS transistor 306 and the through-gate-implanted region 346 of the DEPMOS transistor 308. An implant energy of the p-type dopants 380 is high enough for the p-type dopants 380 to penetrate the gate 318 to form the threshold adjustment layer 328 under the gate dielectric layer 316 in the PMOS transistor 306 and to penetrate the gate 334 form the drift enhancement layer 348 and the threshold adjustment layer 350 under the gate dielectric layer 332 in the DEPMOS transistor 308. The implant energy of the p-type dopants 380 also provides desired depths for the source/drain graded regions 330 in the PMOS transistor 306 and for the drain graded region 352 in the DEPMOS transistor 308. Forming the through-gate-implanted region 346 of the DEPMOS transistor 308 concurrently with the through-gate-implanted region 326 of the PMOS transistor 306 may desirably reduce fabrication cost and complexity of the integrated circuit 300. The p-type dopants 376 of FIG. 4A and the additional p-type dopants 380 may optionally be implanted in a different order. The implant mask 374 is removed after the p-type dopants 376 and the additional p-type dopants 380 are implanted.

Referring to FIG. 4C, the sidewall spacers 320 laterally adjacent to the gate 318 of the PMOS transistor 306, the sidewall spacers 336 laterally adjacent to the gate 334 of the DEPMOS transistor 308, and the sidewall spacers 360 laterally adjacent to the gate 358 of the low-voltage PMOS transistor 310 are formed. The source/drain regions 322 of the PMOS transistor 306, the drain region 340 and the source region 342 of the DEPMOS transistor 308, and the source/drain regions 362 of the low-voltage PMOS transistor 310 are subsequently formed by implanting p-type dopants such as boron into the substrate 302 at a total dose of, for example, $5 \times 10^{14}$ cm$^{-2}$ to $5 \times 10^{16}$ cm$^{-2}$, followed by an activation anneal which diffuses and activate the implanted dopants. Fabrication is continued to produce the integrated circuit 300 of FIG. 3.

Figure 5:
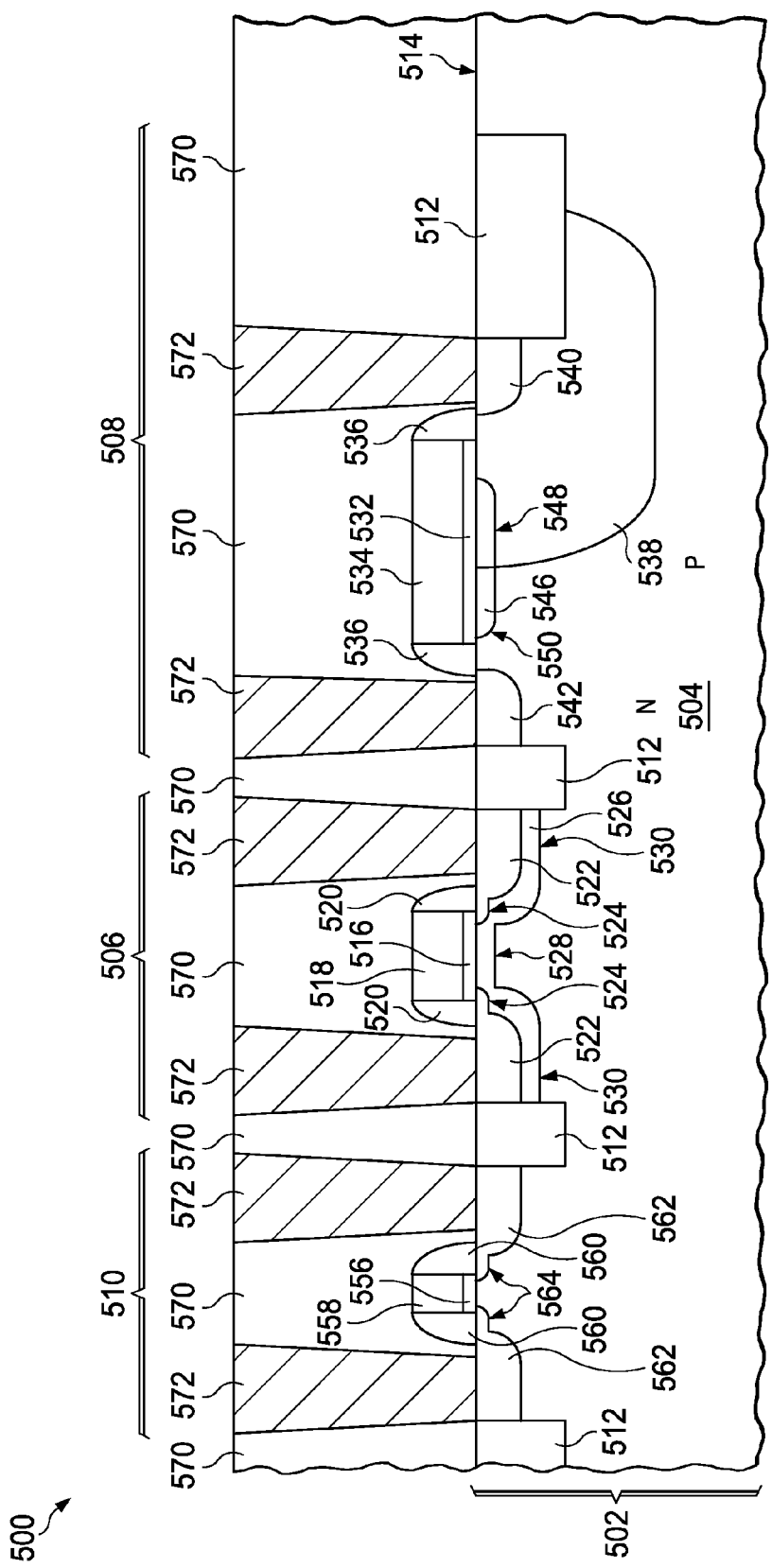
FIG. 5 is a cross section of a further example integrated circuit.

FIG. 5 is a cross section of a further example integrated circuit. The integrated circuit 500 is formed on a substrate 502 which includes n-type semiconductor material 504. The integrated circuit 500 includes a PMOS transistor 506, a DEPMOS transistor 508 and possibly a low-voltage PMOS transistor 510. Field oxide 512 is disposed at a top surface 514 of the substrate 502 so as to laterally isolate the PMOS transistor 506, the DEPMOS transistor 508 and the low-voltage PMOS transistor 510.

The PMOS transistor 506 includes a gate dielectric layer 516 on the substrate 502, a gate 518 on the gate dielectric layer 516, sidewall spacers 520 laterally adjacent to the gate 518, p-type source/drain regions 522 in the substrate 502 adjacent to the gate 518 with drain extensions 524 extending partway under the gate 518. The PMOS transistor 506 further includes a through-gate-implanted region 526 in the substrate 502 under the gate dielectric layer 516 and the source/drain regions 522. A net doping in the through-gate-implanted region 526 is n-type, as a dose of p-type dopants used to form the through-gate-implanted region 526 is low enough so as not to counterdope the n-type semiconductor material 504 to p-type. The through-gate-implanted region 526 includes a threshold adjustment layer 528 under the gate dielectric layer 516 and source/drain graded regions 530 under the source/drain regions 522.

The DEPMOS transistor 508 includes a gate dielectric layer 532 on the substrate 502, a gate 534 on the gate dielectric layer 532, and sidewall spacers 536 laterally adjacent to the gate 534. A thickness of the gate dielectric layer 532 of the DEPMOS transistor 508 may be substantially equal to a thickness of the gate dielectric layer 516 of the PMOS transistor 506. The DEPMOS transistor 508 also includes a p-type drift region 538 in the substrate 502 extending partway under the gate 534. The DEPMOS transistor 508 also includes a p-type drain region 540 in the substrate 502 abutting the drift region 538. In the instant example, the drain region 540 is adjacent to the gate 534. The DEPMOS transistor 508 also includes a p-type source region 542 in the substrate 502 adjacent to the gate 534. The DEPMOS transistor 508 further includes a through-gate-implanted region 546 in the substrate 502 under the gate 534. The through-gate-implanted region 546 includes a drift enhancement layer 548 in the drift region 538 under the gate dielectric layer 532; the drift enhancement layer 548 does not extend to an end of the gate 534 closest to the drain region 540. In the instant example, the through-gate-implanted region 546 also includes a threshold adjustment layer 550 in the p-type semiconductor material 504 under the gate 534.

The optional low-voltage PMOS transistor 510, if present, includes a gate dielectric layer 556 on the substrate 502, a gate 558 on the gate dielectric layer 556, and sidewall spacers 560 laterally adjacent to the gate 558. The gate dielectric layer 556 of the low-voltage PMOS transistor 510 is thinner than, possibly one-third to two-thirds as thick as, the gate dielectric layer 516 of the PMOS transistor 506. The low-voltage PMOS transistor 510 also includes p-type source/drain regions 562 in the substrate 502 adjacent to the gate 558 with drain extensions 564 extending partway under the gate 558. The low-voltage PMOS transistor 510 is free of a through-gate-implanted region similar to the through-gate-implanted regions 526 and 546 in the PMOS transistor 506 and the DEPMOS transistor 508, respectively.

The integrated circuit 500 includes a PMD layer 570 as described in reference to FIG. 1. Contacts 572 are formed through the PMD layer 570 to make electrical connections to the source/drain regions 522 of the PMOS transistor 506, the drain region 540 and the source region 542 of the DEPMOS transistor 508, and the source/drain regions 562 of the low-voltage PMOS transistor 510. The drift enhancement layer 548 in the drift region 538 under the gate 534 of the DEPMOS transistor 508, and the threshold adjustment layer 550 in the n-type semiconductor material 504 under the gate 534 provide the advantages described in reference to FIG. 1. An integrated circuit containing an NMOS transistor and a DENMOS transistor similar to the instant example may accrue the same advantages of the instant example.

Figure 6A:
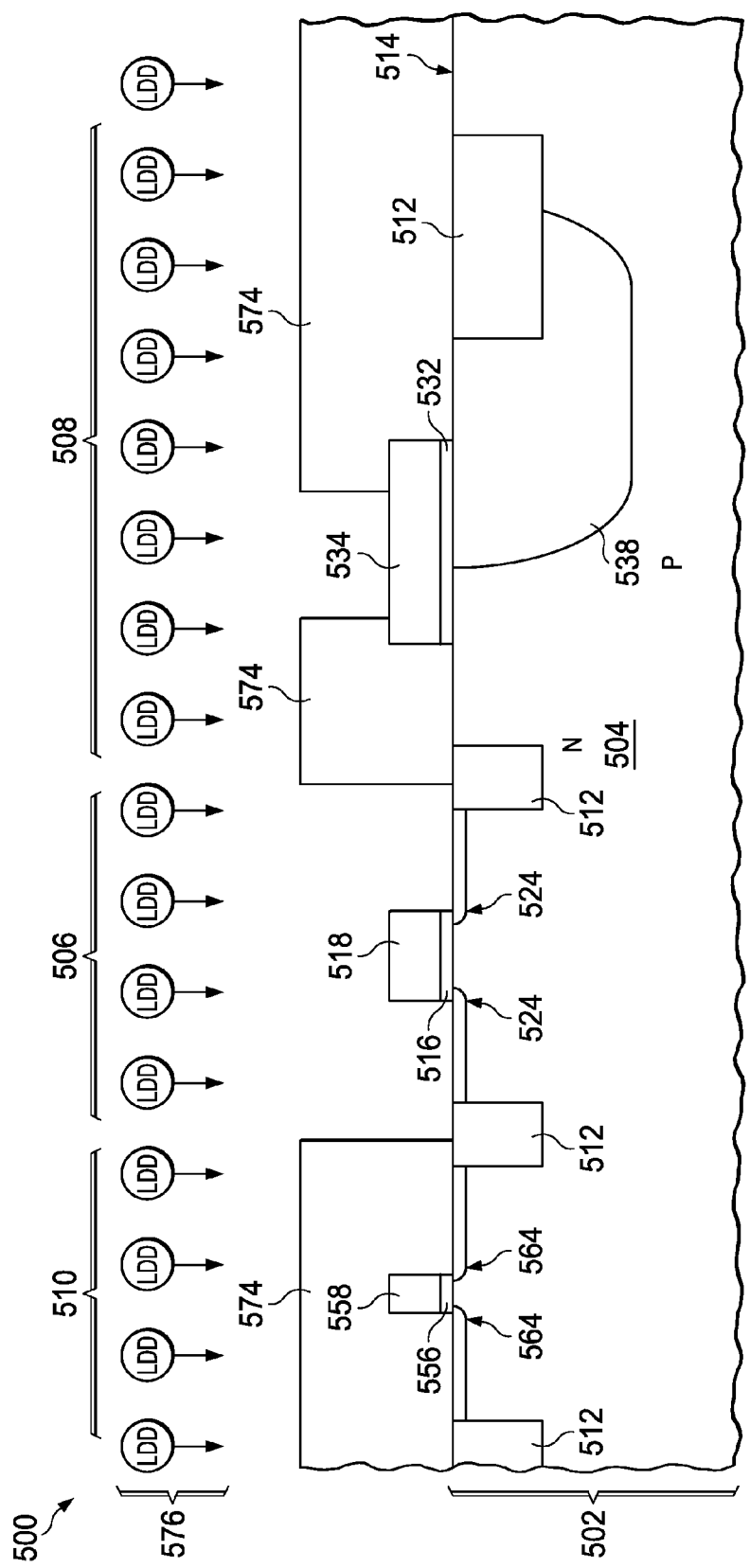
FIG. 6A through FIG. 6C are cross sections of the integrated circuit of FIG. 5, depicted at key stages of fabrication.
Figure 6B:
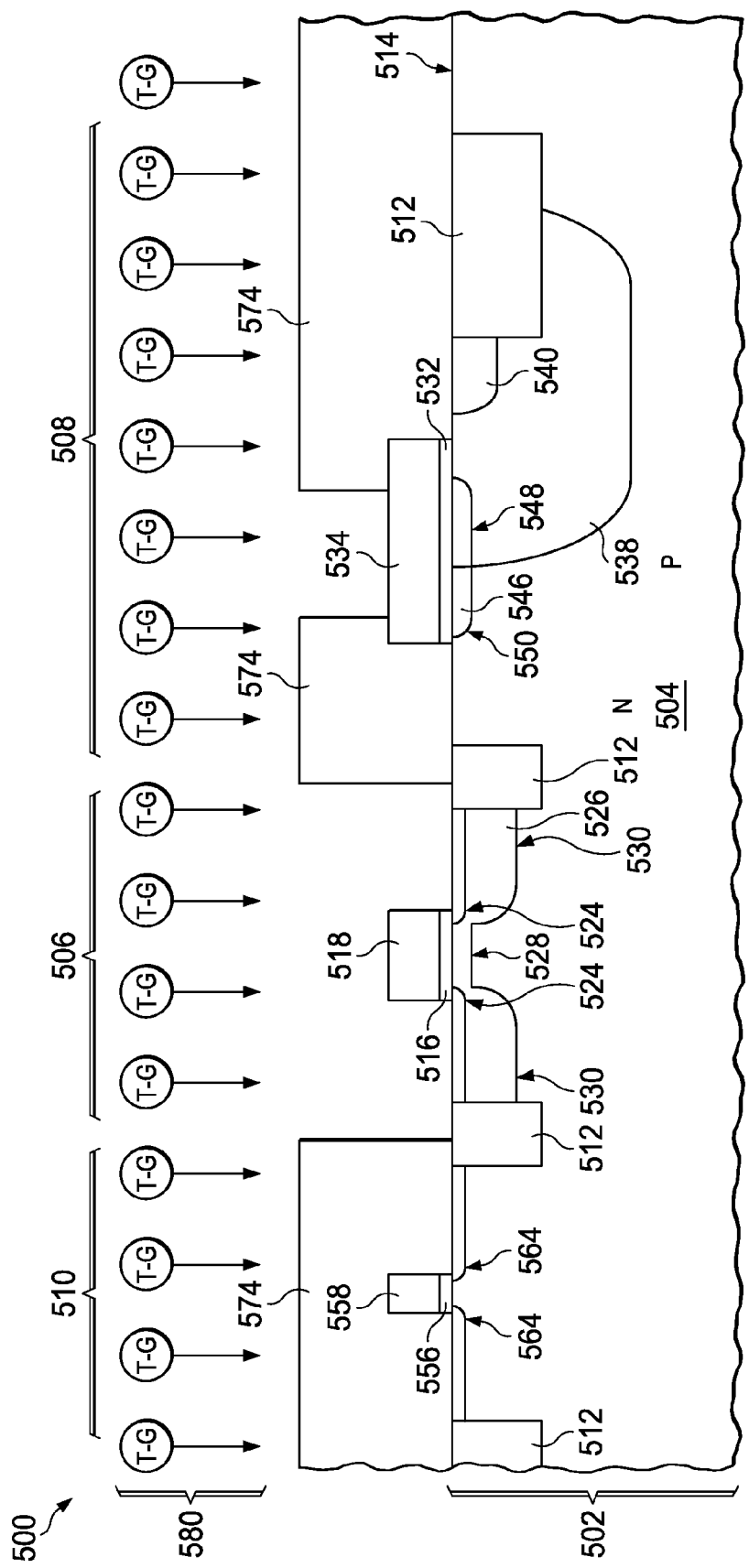
Figure 6C:
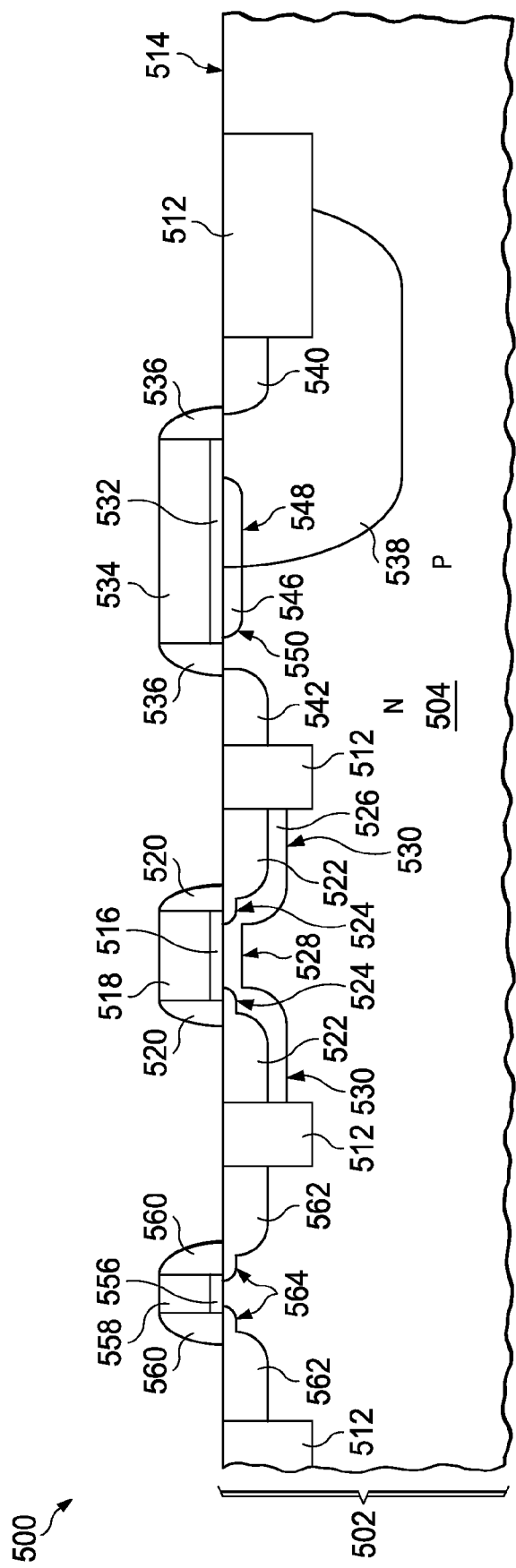

FIG. 6A through FIG. 6C are cross sections of the integrated circuit of FIG. 5, depicted at key stages of fabrication. Referring to FIG. 6A, the integrated circuit 500 includes the field oxide 512 laterally isolating the PMOS transistor 506, the DEPMOS transistor 508 and the low-voltage PMOS transistor 510. The drift region 538 of the DEPMOS transistor 508 may be formed, for example, as described in reference to FIG. 4A. The gate dielectric layer 516 of the PMOS transistor 506 and the gate dielectric layer 532 of the DEPMOS transistor 508 are formed at the top surface 514 of the substrate 502, possibly concurrently. The gate dielectric layer 556 of the low-voltage PMOS transistor 510 is formed at the top surface 514 of the substrate 502, at least a portion separately from the gate dielectric layer 516 of the PMOS transistor 506. The gate 518 of the PMOS transistor 506, the gate 534 of the DEPMOS transistor 508, and the gate 558 of the low-voltage PMOS transistor 510 are formed, possibly concurrently, on the gate dielectric layer 516 of the PMOS transistor 506, the gate dielectric layer 532 of the DEPMOS transistor 508 and the gate dielectric layer 556 of the low-voltage PMOS transistor 510, respectively. The p-type drain extensions 564 of the low-voltage PMOS transistor 510 are formed in the substrate 502 adjacent to the gate 558, for example as described in reference to FIG. 4A.

An implant mask 574 is formed over the integrated circuit 500 so as to expose the PMOS transistor 506, and a portion of the gate 534 of the DEPMOS transistor 508. In the instant example, the implant mask 574 covers source and drain areas of the DEPMOS transistor 508. The implant mask 574 also covers the low-voltage PMOS transistor 510. P-type dopants 576 such as boron, labeled "LDD" in FIG. 6A, are implanted into the substrate adjacent to the gate 518 to form the drain extensions 524 of the PMOS transistor 506. An implant energy of the p-type dopants 576 is low enough so that no significant portion, that is less than 1 percent, of the p-type dopants 576 penetrates the gates 518 and 534.

Referring to FIG. 6B, the implant mask 574 remains in place. Additional p-type dopants 580 such as boron, labeled "T-G" in FIG. 6B, are implanted into the substrate 502 to form the through-gate-implanted region 526 of the PMOS transistor 506 and the through-gate-implanted region 546 of the DEPMOS transistor 508. An implant energy of the p-type dopants 580 is high enough for the p-type dopants 580 to penetrate the gate 518 to form the threshold adjustment layer 528 under the gate dielectric layer 516 in the PMOS transistor 506 and to penetrate the gate 534 form the drift enhancement layer 548 and the threshold adjustment layer 550 under the gate dielectric layer 532 in the DEPMOS transistor 508. The implant energy of the p-type dopants 580 also provides desired depths for the source/drain graded regions 530 in the PMOS transistor 506. Forming the through-gate-implanted region 546 of the DEPMOS transistor 508 concurrently with the through-gate-implanted region 526 of the PMOS transistor 506 may desirably reduce fabrication cost and complexity of the integrated circuit 500. The p-type dopants 576 of FIG. 6A and the additional p-type dopants 580 may optionally be implanted in a different order. The implant mask 574 is removed after the p-type dopants 576 and the additional p-type dopants 580 are implanted.

Referring to FIG. 6C, the sidewall spacers 520 laterally adjacent to the gate 518 of the PMOS transistor 506, the sidewall spacers 536 laterally adjacent to the gate 534 of the DEPMOS transistor 508, and the sidewall spacers 560 laterally adjacent to the gate 558 of the low-voltage PMOS transistor 510 are formed. The source/drain regions 522 of the PMOS transistor 506, the drain region 540 and the source region 542 of the DEPMOS transistor 508, and the source/drain regions 562 of the low-voltage PMOS transistor 510 are subsequently formed for example as described in reference to FIG. 4C. Fabrication is continued to produce the integrated circuit 500 of FIG. 5.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. An integrated circuit, comprising:
   a substrate comprising p-type semiconductor material;
   an n-channel metal oxide semiconductor (NMOS) transistor, comprising a through-gate-implanted region in said substrate under a gate dielectric layer of said NMOS transistor and under source/drain regions of said NMOS transistor, said through-gate-implanted region of said NMOS transistor comprising n-type dopants, such that a net doping in said through-gate-implanted region is p-type, said through-gate-implanted region of said NMOS transistor including a threshold adjustment layer under said gate dielectric layer and source/drain graded regions under said source/drain regions of said NMOS transistor; and
   a drain extended n-channel metal oxide semiconductor (DENMOS) transistor, comprising a drift region extending from a drain region of said DENMOS transistor to partway under a gate of said DENMOS transistor, and comprising a through-gate-implanted region in said substrate under a gate dielectric layer of said DENMOS transistor, said through-gate-implanted region of said DENMOS transistor comprising n-type dopants, such that a net doping in said through-gate-implanted region is p-type, said through-gate-implanted region of said DENMOS transistor including a drift enhancement layer in said drift region under a gate dielectric layer of said DENMOS transistor, such that said drift enhancement layer does not extend to an end of said gate of said DENMOS transistor closest to said drain region of said DENMOS transistor.

2. The integrated circuit of claim 1, in which:
   said drain region of said DENMOS transistor is laterally separated from said gate of said DENMOS transistor;
   metal silicide is disposed on said drain region; and
   a silicide block is disposed over said substrate between said gate of said DENMOS transistor and said drain region of said DENMOS transistor so that said substrate between said gate of said DENMOS transistor and said drain region of said DENMOS transistor is free of said metal silicide.

3. The integrated circuit of claim 1, in which:
   said drain region of said DENMOS transistor is laterally separated from said gate of said DENMOS transistor;
   metal silicide is disposed on said drain region; and
   field oxide is disposed in said substrate between said gate of said DENMOS transistor and said drain region of said DENMOS transistor so that said substrate between said gate of said DENMOS transistor and said drain region of said DENMOS transistor is free of said metal silicide, said drift region extending below said field oxide.

4. The integrated circuit of claim 1, in which said drain region of said DENMOS transistor is adjacent to said gate of said DENMOS transistor.

5. The integrated circuit of claim 1, in which said through-gate-implanted region of said DENMOS transistor includes a threshold adjustment layer in said p-type semiconductor material under said gate of said DENMOS transistor.

6. The integrated circuit of claim 1, comprising a low-voltage NMOS transistor comprising a gate dielectric layer which is thinner than said gate dielectric layer of said NMOS transistor, said low-voltage NMOS transistor being free of a through-gate-implanted region.

7. An integrated circuit, comprising:
   a substrate comprising n-type semiconductor material;
   a p-channel metal oxide semiconductor (PMOS) transistor, comprising a through-gate-implanted region in said substrate under a gate dielectric layer of said PMOS transistor and under source/drain regions of said PMOS transistor, said through-gate-implanted region of said PMOS transistor comprising p-type dopants, such that a net doping in said through-gate-implanted region is n-type, said through-gate-implanted region of said PMOS transistor including a threshold adjustment layer under said gate dielectric layer and source/drain graded regions under said source/drain regions of said PMOS transistor; and
   a drain extended p-channel metal oxide semiconductor (DEPMOS) transistor, comprising a drift region extending from a drain region of said DEPMOS transistor to partway under a gate of said DEPMOS transistor, and comprising a through-gate-implanted region in said substrate under a gate dielectric layer of said DEPMOS transistor, said through-gate-implanted region of said DEPMOS transistor comprising p-type dopants, such that a net doping in said through-gate-implanted region is n-type, said through-gate-implanted region of said DEPMOS transistor including a drift enhancement layer in said drift region under a gate dielectric layer of said DEPMOS transistor, such that said drift enhancement layer does not extend to an end of said gate of said DEPMOS transistor closest to said drain region of said DEPMOS transistor.

8. The integrated circuit of claim 7, in which:
said drain region of said DEPMOS transistor is laterally separated from said gate of said DEPMOS transistor;
metal silicide is disposed on said drain region; and
a silicide block is disposed over said substrate between said gate of said DEPMOS transistor and said drain region of said DEPMOS transistor so that said substrate between said gate of said DEPMOS transistor and said drain region of said DEPMOS transistor is free of said metal silicide.

9. The integrated circuit of claim 7, in which:
said drain region of said DEPMOS transistor is laterally separated from said gate of said DEPMOS transistor;
metal silicide is disposed on said drain region; and
field oxide is disposed in said substrate between said gate of said DEPMOS transistor and said drain region of said DEPMOS transistor so that said substrate between said gate of said DEPMOS transistor and said drain region of said DEPMOS transistor is free of said metal silicide, said drift region extending below said field oxide.

10. The integrated circuit of claim 7, in which said drain region of said DEPMOS transistor is adjacent to said gate of said DEPMOS transistor.

11. The integrated circuit of claim 7, in which said through-gate-implanted region of said DEPMOS transistor includes a threshold adjustment layer in said n-type semiconductor material under said gate of said DEPMOS transistor.

12. The integrated circuit of claim 7, comprising a low-voltage PMOS transistor comprising a gate dielectric layer which is thinner than said gate dielectric layer of said PMOS transistor, said low-voltage PMOS transistor being free of a through-gate-implanted region.

13. A method of forming an integrated circuit, comprising the steps:
providing a substrate comprising semiconductor material of a first conductivity type;
forming a drift region of a drain extended metal oxide semiconductor (DEMOS) transistor in said substrate, said drift region having a second, opposite, conductivity type;
forming a gate of said DEMOS transistor on a gate dielectric layer of said DEMOS transistor, so that said drift region extends partway under said gate of said DEMOS transistor;
forming an implant mask so as to expose a metal oxide semiconductor (MOS) transistor and a portion of said gate of said DEMOS transistor;
implanting a first set of dopants of said second conductivity type into said substrate in areas exposed by said implant mask to form drain extensions of said second conductivity type adjacent to a gate of said MOS transistor, such that an implant energy of said first set of dopants is low enough so that less than 1 percent of said first set of dopants penetrates said gate of said DEMOS transistor and said gate of said MOS transistor; and
implanting a second set of dopants of said second conductivity type into said substrate in areas exposed by said implant mask to form a through-gate-implanted region of said MOS transistor in said substrate under a gate dielectric layer of said MOS transistor and to form a through-gate-implanted region of said DEMOS transistor in said substrate under said gate dielectric layer of said DEMOS transistor, such that a net doping in said through-gate-implanted region said MOS transistor and said through-gate-implanted region of said DEMOS transistor is said first conductivity type, said through-gate-implanted region of said DEMOS transistor including a drift enhancement layer in said drift region under said gate dielectric layer of said DEMOS transistor, such that said drift enhancement layer does not extend to an end of said gate of said DEMOS transistor closest to a drain region of said DEMOS transistor.

14. The method of claim 13, in which said drain region of said DEMOS transistor is laterally separated from said gate of said DEMOS transistor, and further comprising the steps:
forming a silicide block is over said substrate between said gate of said DEMOS transistor and said drain region of said DEMOS transistor; and
forming metal silicide on said drain region, so that said substrate between said gate of said DEMOS transistor and said drain region of said DEMOS transistor is free of said metal silicide.

15. The method of claim 13, in which said drain region of said DEMOS transistor is laterally separated from said gate of said DEMOS transistor, and further comprising the steps:
forming field oxide in said substrate between said gate of said DEMOS transistor and said drain region of said DEMOS transistor; and
forming metal silicide on said drain region, so that said substrate between said gate of said DEMOS transistor and said drain region of said DEMOS transistor is free of said metal silicide.

16. The method of claim 13, in which said drain region of said DEMOS transistor is adjacent to said gate of said DEMOS transistor.

17. The method of claim 13, in which said through-gate-implanted region of said DEMOS transistor includes a threshold adjustment layer in said semiconductor material of said first conductivity type under said gate of said DEMOS transistor.

18. The method of claim 13, in which said implant mask covers a low-voltage MOS transistor of said integrated circuit.

19. The method of claim 13, in which:
said first conductivity type is p-type;
said second conductivity type is n-type;
said MOS transistor is an NMOS transistor; and
said DEMOS transistor is a DENMOS transistor.

20. The method of claim 13, in which:
said first conductivity type is n-type;
said second conductivity type is p-type;
said MOS transistor is a PMOS transistor; and
said DEMOS transistor is a DEPMOS transistor.

* * * * *